United States Patent [19]

Rice

[11] 4,375,072
[45] Feb. 22, 1983

[54] SELF-CALIBRATING OVERCURRENT DETECTOR

[75] Inventor: Anthony J. Rice, La Gaude, France

[73] Assignee: International Business Machines Corporation, Armonk, N.Y.

[21] Appl. No.: 248,742

[22] Filed: Mar. 30, 1981

[30] Foreign Application Priority Data

Apr. 10, 1980 [FR] France .................. 80 08341

[51] Int. Cl.³ ............................................. H02H 3/08
[52] U.S. Cl. ...................................... 361/87; 361/93;
324/51; 324/130; 364/483
[58] Field of Search ........................... 361/87, 93, 31;
324/130, 51; 340/664; 364/571, 483, 580

[56] References Cited

U.S. PATENT DOCUMENTS

| | | | |
|---|---|---|---|
| 3,626,262 | 12/1971 | Kelling | 318/39 |
| 3,979,255 | 9/1976 | Bulgier et al. | 176/20 R |
| 4,012,669 | 3/1977 | Gelfand et al. | 361/87 X |
| 4,160,282 | 7/1979 | Dolinar et al. | 361/31 |
| 4,208,625 | 6/1980 | Piso | 324/130 X |

FOREIGN PATENT DOCUMENTS 2344159 10/1977 France .

*Primary Examiner*—Reinhard H. Eisenzopf
*Attorney, Agent, or Firm*—Frederick D. Poag

[57] ABSTRACT

Circuit for detecting a fault current in an installation where the load (RL) varies. Total current (IS) is converted into a voltage (VS). During an initialization cycle, means such as counter (9), digital-to-analog converter (10), comparator (5), resistors (R1, R2) generate a voltage (VS) equal to VS at the end of the initialization cycle, and a threshold voltage VS=kVS. During operation, voltage VS is compared with threshold VD in order to provide a fault detection indication which is transmitted to the protection circuit by a logic circuit, that is, AND gate (17) and OR gate (19). During the initialization cycle, protection is obtained by comparing VS with a reference voltage in a comparator (7). This device is used to protect machines having an expandable configuration.

10 Claims, 4 Drawing Figures

SELF-CALIBRATING OVERCURRENT DETECTOR

TECHNICAL FIELD

The present invention is related to an overcurrent detector whose detection threshold is self-calibrating so that it is well suited for machine protection.

For example, in a power supply system supplying a current to feed a load, a fault condition in the load causes an overcurrent, henceforth referred to as fault current, to be drawn from the power supply. This fault current causes short-circuits, considered as additional faults, which increase the fault current.

BACKGROUND ART

It is, therefore, necessary to implement at the power supply output a protection device to prevent the fault current from increasing so that it cannot reach the limit where the sum of the load and fault currents is equal to the maximum current which the power supply can deliver.

In general, power supplies which supply a power exceeding 20A use a circuit breaker tripped at a fixed threshold.

This solution cannot be implemented in a machine where the load to be supplied is not always the same and depends on the user requirements. For example, in a teleprocessing system including a communication controller of an architecture type such as illustrated in FIG. 1 of the European patent application, published under number 0005722, a power supply unit is used for one or more line adapters. Therefore, depending on the network configuration, that is, on the number of terminals, the power supply load varies in a proportion of 1 to 4. Under these circumstances, not all network configurations can be protected satisfactorily.

This problem can be solved by measuring the load current at machine installation time and by adjusting the tripping point of the circuit breaker manually. However, this complicates the installation steps and produces a source of additional human errors so that it is hardly satisfactory.

The detection thresholds can also be adjusted automatically by program, as described in the IBM Technical Disclosure Bulletin, Vol. 20, No. 9, Feb. 1978, page 3589. It is obvious that this possibility can only be used in machines including microprocessors; it also complicates the steps required to make these machines operational because in addition to the operations generally required for this, it is necessary to choose the limiting values and to load these into storage, which requires the intervention of a field engineer.

SUMMARY OF THE INVENTION

The object of the present invention is, therefore, to design a self-calibrating overcurrent detector having a self-adjustable threshold in order to protect machines having an expandable configuration.

In accordance with the invention, the detection circuit includes means for generating a first voltage which is proportional to the current provided by the power supply, and means which are activated during the initialization cycle in order to generate a second voltage equal to the initial value of the first voltage, and to derive from this second voltage a threshold voltage to be used as current detection threshold during operation time. During the initialization cycle, protection is ensured by a fixed-threshold detection circuit which operates at a reference voltage.

This circuit causes the detection threshold to be adjusted as soon as the initialization cycle is terminated depending on the load to supply; consequently, it adapts to any machine configuration.

Further objects, features and advantages of the present invention will be described in more detail in the following, with reference to the appended drawings which represent the preferred embodiment thereof.

DETAILED DESCRIPTION

Figure 1:
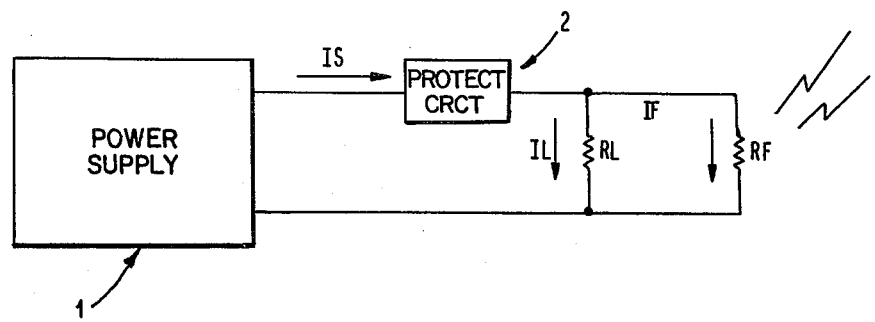
FIG. 1 shows a diagram of the power supply of a machine, illustrating the problem to be solved.

FIG. 1 illustrates schematically the problem to be solved by the circuit of the present invention. A power supply 1 delivering a fixed voltage supplies a current IS to a useful load which can be made up by the whole or part of the machine. The load is represented by a resistor RL which draws a load current IL. If certain fault conditions occur in the load, for example breakdown of a capacitor or a short-circuit, an additional fault current, referred to as IF in the figure, is drawn from the power supply. The heat dissipated as a result of this overcurrent can cause breakdown conditions which in turn increase current IF until $$IL + IF = IS$$

where IS is the maximum current which can be supplied by the power supply.

In order to limit IF, it is necessary to add to the circuit a protection circuit 2 which breaks the circuit at a given threshold current.

In an installation where load variations depend on the machine configuration, and where the maximum current IS is high, it is not possible to use fixed threshold protection circuits, as will be shown in the following.

For a power supply delivering an operation current of 80A, it can be assumed that, depending upon the configuration of the machine installed and upon the number of network terminals in case of a teleprocessing system, the load current can vary between 20 and 80A. Therefore, if the power supply can supply a maximum output current of 100A, the tripping current must be adjusted to 100A, so that, depending on the load, current IF varies between 20 and 80A.

If a fault current of 20A proves satisfactory for a maximum configuration where IL=80A, a fault current of 80A for a minimum configuration where IL=20A would cause too much damage and is not acceptable.

Figure 2:
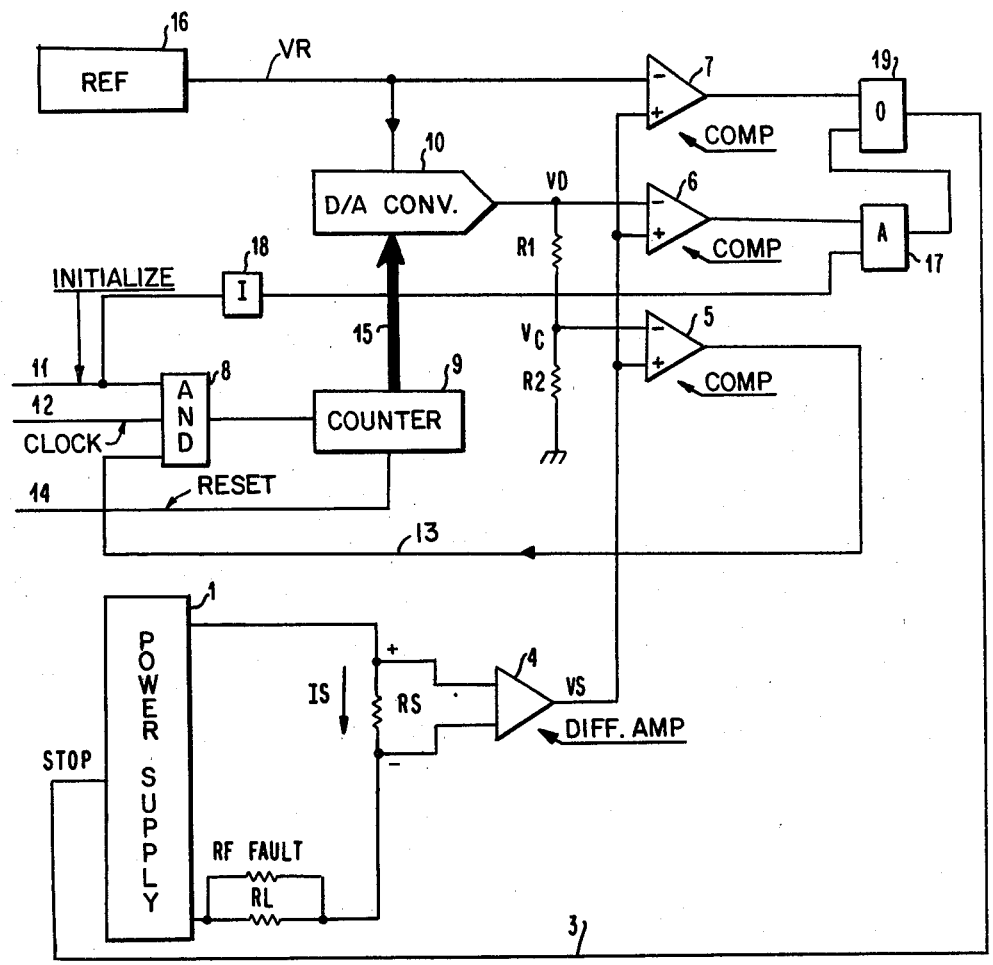
FIG. 2 shows the self-calibrating overcurrent detector according to the present invention.

Therefore, the circuit shown in FIG. 2 provides adequate protection whatever the machine configuration. The circuit permits automatic initialization of the detection threshold as soon as the machine is powered.

FIG. 2 gives a schematic representation of power supply 1 and the variable load RL, which are elements of FIG. 1. The detection circuit according to the present invention generates a control signal on line 3 to interrupt the supply if a fault condition is detected which would cause the machine to stop.

A resistor RS is included in the power circuit and a differential amplifier 4 is placed at the terminals of this resistance to provide an output voltage VS proportional to current IS without modifying this current to a great extent.

This voltage VS is applied to the three plus inputs of the three comparators 5, 6, 7. A logic circuit including AND gate 8, a counter 9, a digital-to-analog converter 10 supplies at the output of converter 10 the input to comparator 6. A resistor bridge R1, R2 is connected between the output of converter 10 and ground, the common point of resistors R1 and R2 forming the input of comparator 5.

The AND circuit 8 has three inputs; a first input 11 receives an initialization signal, a second input 12 receives a clock signal, and the third input 13 is connected to the output of comparator 5. The output of circuit 8 delivers the control signal to counter 9. Counter 9 is reset by a signal on line 14. The output bus 15 of the counter is connected to the inputs of the digital-to-analog converter 10.

A reference voltage VR supplied by a generator 16 is applied to the minus input of comparator 7. This reference voltage VR is also used by converter 10.

One of the inputs of AND gate 17 receives the output of comparator 6, the other input receives the initialization signal inverted by inverter 18. The output of AND gate 17 is connected to the input of OR gate 19 whose second input is connected to the output of comparator 7. The output of OR gate 19 provides the control signal which interrupts the power supply if a fault condition is detected.

All circuit elements are of the conventional type and currently used in electronic devices; they are, therefore, not described in detail.

Figure 3:
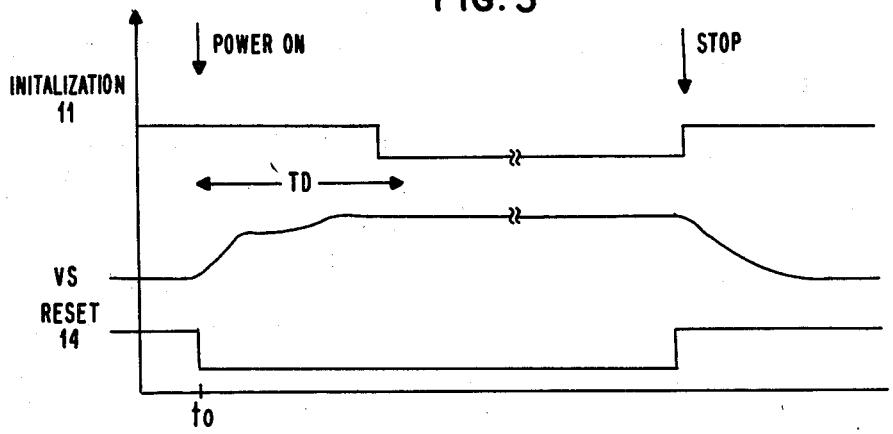
FIG. 3 shows a timing chart of the voltages at given points in the circuit of FIG. 2.

The detection device operates as follows: At power-on time, current IS, and then voltage VS, will progressively increase until they reach the nominal value depending on the machine configuration, which is represented by load RL. This voltage VS is illustrated in the diagram of FIG. 3. Voltage VS is stabilized after a time TD corresponding to the initialization cycle. When the machine is powered, the content of the counter is zero, because it was reset at machine stop time. Therefore, the output of converter 10 is zero, and hence the voltages VD and VC on the minus inputs of the comparators are null.

When VS becomes different from zero during the initialization cycle, comparators 5 and 6 detect this condition. Comparator 5 delivers a counting control signal on line 13. Because the signal on line 11 is up, gate 8 is conditioned and lets pass the clock pulse applied to counter 9 which starts counting.

Therefore, voltage VD at the converter output as well as voltage VC increase. The ratio of resistors R1 and R2 is chosen so that VD=1.2VC.

Assuming a clock signal frequency of 10 KHz and an initialization cycle of two seconds, voltage VC will be equal to VS at the end of the initialization cycle so that the output of comparator 5 becomes null and AND gate 8 does no longer let pass the clock signals. The content of counter 9 is frozen so that VC remains at the initial value of VS and the load current is memorized.

At the end of the initialization cycle TD (FIG. 3), the inverter 18 supplies a logical UP signal which conditions AND gate 17. Therefore, if voltage VS thereafter increases because of a fault condition in the machine, and exceeds the threshold voltage VD, that is 1.2 times the initial value of VS, comparator 6 provides an UP level to AND gate 17. Thus, AND gate 17 provides a power interruption control signal to circuit 1 through OR gate 19 and line 3.

The threshold value which is equal to 1.2 times the initial value of VS is self-calibrating depending on the load current during initialization.

In order to protect the machine during the initialization cycle where AND gate 17 is not conditioned and where the detection threshold is not yet set up, a fixed threshold VR supplied by voltage generator 16 to the minus input of comparator 7 is used. As soon as voltage VS exceeds this threshold, comparator 7 supplies a signal which is transmitted by OR gate 19 and interrupts the power supply.

Condition VS (FAULT)=1.2VC corresponds to a fault current IF=0.2IL. In effect, $$VS(\text{FAULT}) = RS(IL + IF) = 1.2 RS IL$$

hence $$IF = 0.2 IL$$

Thus, if for the minimum load IL=20A, IF is equal to 4A only, and for the maximum load IL=80A, IF is equal to 16A, which is acceptable since IF remains below 20A.

Figure 4:
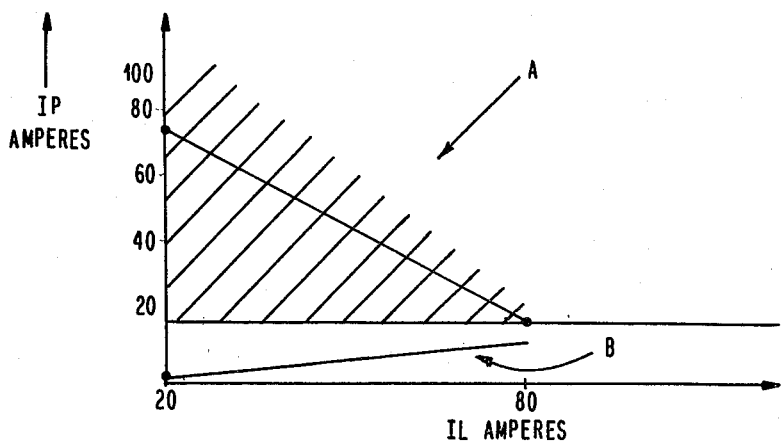
FIG. 4 is a graphic representation comparing the protection provided by the circuit of the present invention and the circuits of the prior art.

The diagram of FIG. 4 permits a comparison between the protection provided by the device of the present invention and a fixed-threshold detection device such as described with reference to FIG. 1. On this curve, the fault current IF is represented as a function of the load current IL for the two cases: fixed-threshold detector curve A, and variable threshold detector of the present invention curve B. It can be seen that for the fixed-threshold detector the fault current varies between 80A and 20A whereas it varies between 4A and 20A, for the variable threshold detector of the present invention. The hatched section above the straight line IF=20A of the fixed threshold device is a zone of insufficient protection because the fault current always exceeds 20A, which is unacceptable, whereas the device of the present invention provides protection for all values of load current IL in the range of 20A to 80A. Furthermore, the elements of the circuit shown in FIG. 2 are of the conventional type and can be easily integrated so that the detector can be designed as an integrated circuit to obtain a high-performance, reduced-size device. While the invention has been particularly shown and described with reference to a preferred embodiment thereof, it will be understood by those skilled in the art that numerous changes in form and detail may be made therein without departing from the spirit and scope of this invention.

I claim:

1. Self-calibrating overcurrent detector characterized in that it includes:
    means for generating a first voltage (VS) which is proportional to the current whose fault value is to be detected,
    means which are active during an initialization cycle for generating a second increasing voltage (VC) which, at the end of the initialization cycle, is equal to the first voltage and for deriving from said second voltage a threshold voltage (VD) such that $VS=kVC$, k being a numerical factor higher than 1, and first means for comparing the threshold voltage with the first voltage in order to provide a fault detection indication after the initialization cycle.

2. Circuit according to claim 1 characterized in that it includes second comparison means for comparing the first voltage to a reference voltage in order to provide a fault detection indication during the initialization cycle.

3. Circuit according to claim 1 or 2 characterized in that it includes means to prevent the first comparison means from generating the fault detection indication during the initialization cycle.

4. Circuit according to claim 3 characterized in that the means for generating the second voltage (VC) include:
 a counter provided with a counting input and a resetting input,
 means for applying to the counting input of the counter clock pulses during the initialization cycle,
 means for generating a count control signal,
 analog-to-digital converter whose input receives the output signals of the counter and which provides the threshold voltage.

5. Circuit according to claims 1 or 2 characterized in that the means for generating the second voltage (VC) include:
 a counter provided with a counting input and a resetting input,
 means for applying to the counting input of the counter clock pulses during the initialization cycle,
 means for generating a count control signal,
 analog-to-digital converter whose input receives the output signals of the counter and which provides the threshold voltage.

6. Circuit according to claim 5 characterized in that the means for generating the second voltage (VC) comprise two resistors mounted in series between the converter output and a second reference voltage, voltage VC being drawn at the common resistor point.

7. Circuit according to claim 6 characterized in that the means for generating the count control signal include third comparison means which compare the first voltage with the second voltage (VC) and provides the count control signal if said second voltage is lower than the first one.

8. Circuit according to claim 7 characterized in that it comprises an AND gate having three inputs, the first input receiving a signal which activates the gate during the initialization cycle and deactivates it during operation time, the second input receiving the clock signal, and the third input receiving the count control signal, and one output connected to the counter input.

9. Circuit according to claim 8 characterized in that the means for preventing the generation of the fault indication during the initialization cycle include a second AND gate having two inputs, the first one receiving a signal to deactivate the gate during the initialization cycle and to activate it during machine operation, the second input being connected to the output of the first comparison means, the output of said gate providing the fault detection indication during the initialization cycle.

10. Circuit according to claim 9 characterized in that it comprises an OR gate having two inputs, the first one receiving the fault detection indication provided by the second comparison means, the second one receiving the indication provided by the second AND gate and whose output generates a control signal to stop the power supply.

* * * * *